Figure 1:
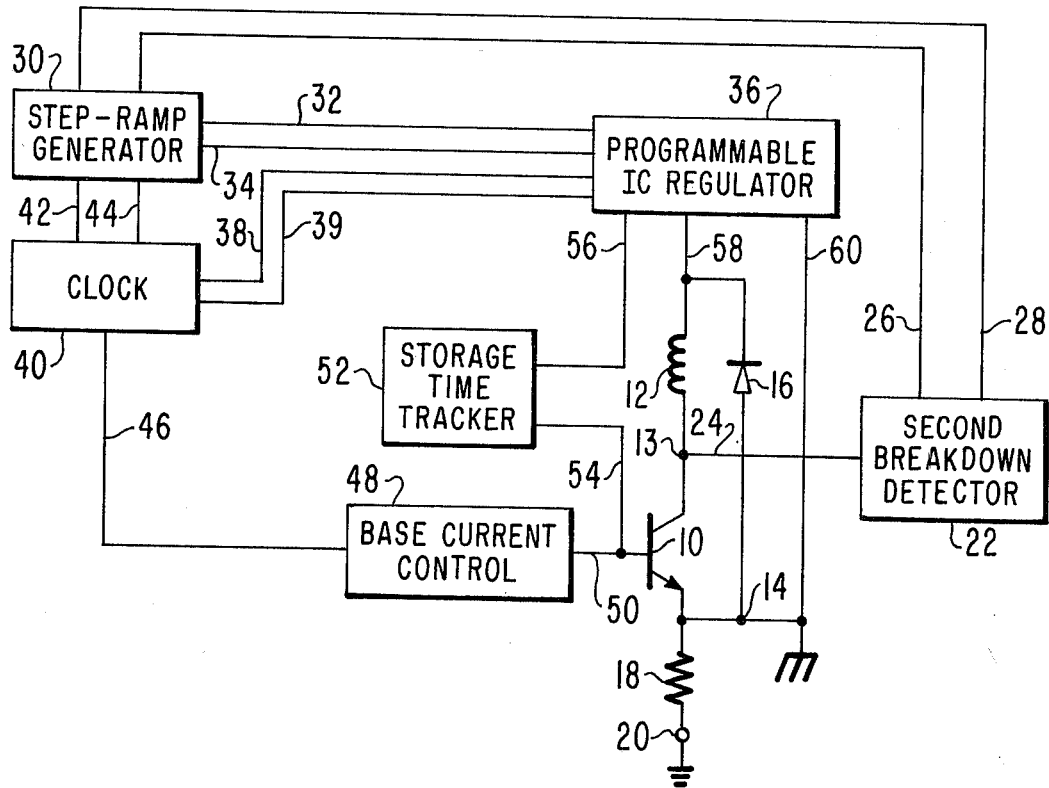

United States Patent [19]
Arnoldi

[11] 3,979,672
[45] Sept. 7, 1976

[54] TRANSISTOR TESTING CIRCUIT

[75] Inventor: Hugh Arnoldi, Londonderry, N.H.

[73] Assignee: RCA Corporation, New York, N.Y.

[22] Filed: Sept. 12, 1975

[21] Appl. No.: 612,738

[52] U.S. Cl. .......................... 324/158 T; 324/158 D
[51] Int. Cl.[2] ......................................... G01R 31/26
[58] Field of Search ......... 324/158 T, 158 D, 158 R

[56] References Cited
UNITED STATES PATENTS 3,371,276   2/1968   Schiff ............................. 324/158 T

OTHER PUBLICATIONS

Sunshine et al.; "Second–Breakdown . . ."; IEEE Trans on Electron Devices; vol. ED–19; July, 1972; pp. 873–885.

*Primary Examiner*—R. V. Rolinec
*Assistant Examiner*—Ernest F. Karlsen
*Attorney, Agent, or Firm*—H. Christoffersen; S. Cohen; F. R. Perillo

[57] ABSTRACT

An automated test set for determining the reverse biased second breakdown characteristics of a bipolar transistor without destroying or degrading the transistor under test (TUT). A source supplies current to the TUT through an inductor. The amplitude of this current increases in predetermined increments. After each current amplitude increase, the base-emitter junction of the TUT is reverse biased and the source is disabled. If enough energy is stored by the inductor to cause second breakdown, this breakdown is detected and the test is terminated. Otherwise, the test continues until the test current reaches a predetermined maximum amplitude, at which time the test is terminated. Damage to the TUT is avoided by restricting the stored energy to levels high enough to cause second breakdown but low enough that the remaining energy does not cause thermal damage.

12 Claims, 2 Drawing Figures

TRANSISTOR TESTING CIRCUIT

Reverse bias second breakdown is a major concern where power transistors are used. The problem is generally more severe in high speed power transistors, particularly when inductive loads are being used. Second breakdown is a condition where the output impedance of a transistor changes almost instantaneously from a large value to a small limiting value. It is an electrically and thermally regenerative process in which current flow is restricted to a very small volume of semiconductor material. This current causes a localized heating which may fuse together a small portion of the collector and emitter, causing transistor failure. It may be distinguished from normal transistor operation by the fact that once it occurs, the base no longer controls the flow of collector current. This form of breakdown should be contrasted with primary or avalanche breakdown. The latter is usually referred to as a sustaining mode of transistor operation and unlike second breakdown is not a failure mode.

While second breakdown may occur in a device under conditions of forward or reverse bias, it is more likely to occur during the latter condition. This is because the reverse bias forces the emitter current to be concentrated in a relatively small region, causing second breakdown to occur at a lower energy level.

The breakdown characteristics of a particular transistor type vary widely from device to device. When such a device is to be used in a circuit having an inductive load, it is desirable to know the energy levels that the device will withstand without failing. It is generally necessary to test 100% of the devices to be used to determine their breakdown characteristics. It has long been a problem in the prior art to develop a testing circuit that will determine the breakdown characteristics of the device without causing any degradation of the device. At the same time, the characteristics of the test circuit must be such that the results obtained from the test can be readily correlated with the results to be expected from the device when used in the intended circuit.

Many circuits have been developed in the prior art for testing a device for reverse biased second breakdown. For example, Schiff, U.S. Pat. No. 3,371,276, discloses a circuit in which a current is applied through an inductor to the collector of the transistor under test while the transistor is periodically pulsed into saturation by current pulses applied to its base circuit. The current or the inductance is increased or both may be increased until, for a predetermined reverse bias at the base, second breakdown occurs. This second breakdown is detected by the presence of a few cycles of oscillation of noise in the radio frequency band, which occurs between the base and the emitter of the transistor under test. In response to this noise, the collector-to-emitter path of the transistor is short-circuited to remove the test voltage applied across the transistor by the inductor.

One factor preventing high correlation between the test results and in-circuit performance is the presence of stray capacitance associated with the test circuit. This capacitance may be present in the inductor used in the test circuit or may be associated with the protective means used to short-circuit the collector-to-emitter path of the transistor under test. The effect of this capacitance is to shunt energy away from the transistor under test, thus giving the impression that the transistor has withstood greater energy stress than it has actually been exposed to. Another problem is the disabling of the current source from the test device at the instant that the latter is cut off.

In the circuit of the present invention, an energy storage means is connected to the conduction path of the transistor under test (TUT) to form a series circuit. Connected in series with this path is means for supplying successively larger currents. After each application of current, there is a concurrent interruption of the current and the transistor bias is changed from a forward to reverse bias condition. When second breakdown occurs, there is a rapid decrease in the collector-to-emitter voltage of the TUT. Means for detecting this rapid decrease are included in the test circuit.

Figure 2:
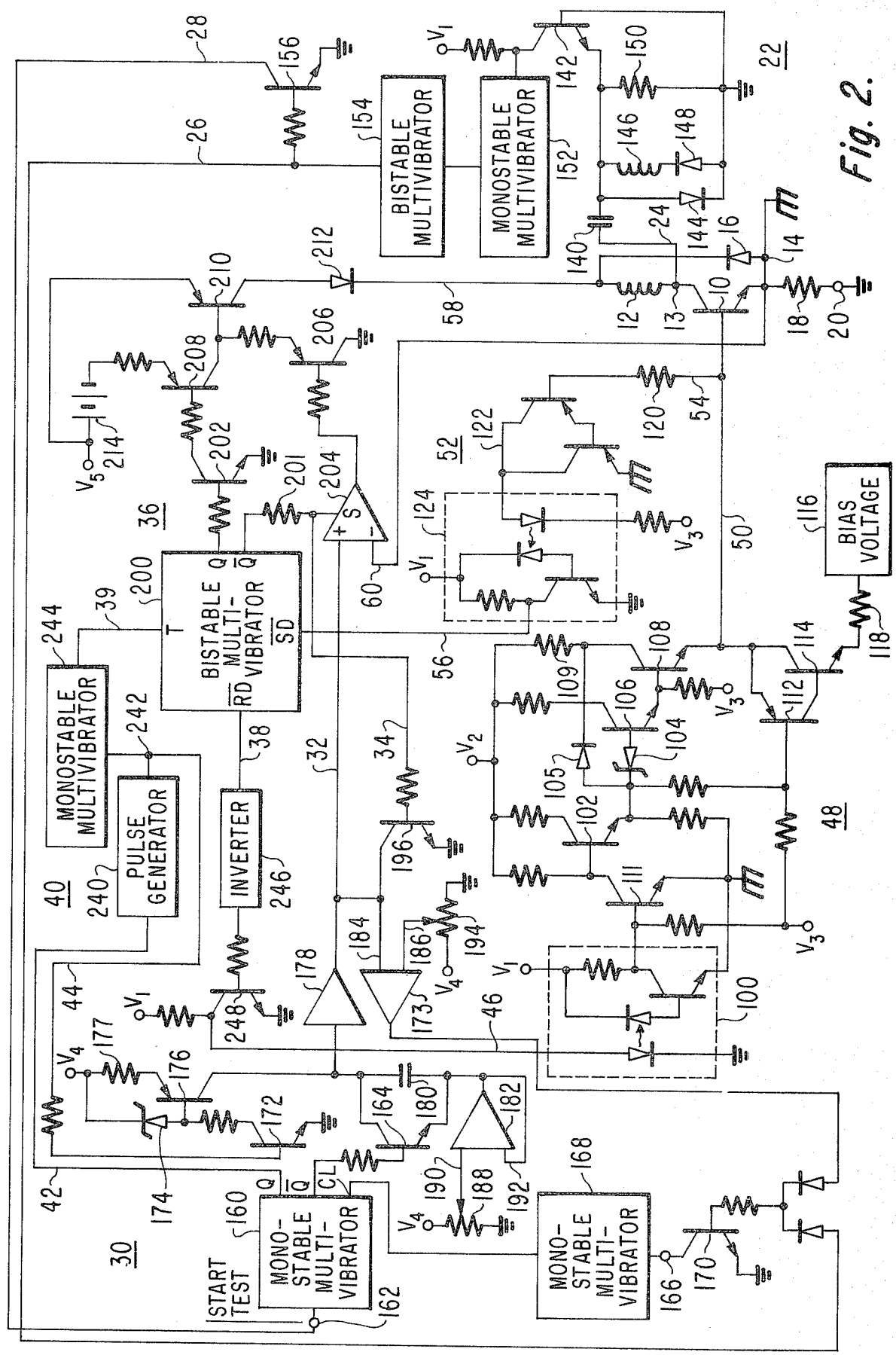

In the drawings:

FIG. 1 is a block and circuit diagram of a preferred embodiment of the invention; and FIG. 2 is a schematic circuit diagram showing in greater detail the circuit of FIG. 1.

In the circuit of FIG. 1, the collector-emitter path of the transistor under test (TUT) 10 is connected between inductor 12 and terminal 14. This terminal is defined herein as the emitter ground. Resistor 18 is connected between terminal 14 and terminal 20. This latter terminal is connected to a reference potential, herein system ground. Line 58 connects inductor 12 to programmable $I_c$ regulator 36. The regulator is coupled to the emitter ground by line 60. The cathode of diode 16 is connected to line 58 while its anode is connected to terminal 14.

Second breakdown detector 22 is connected to the collector electrode 13 of the TUT by line 24 and to step ramp generator 30 by lines 26 and 28. Generator 30 is connected to regulator 36 by lines 32 and 34 and to clock 40 by lines 42 and 44. The clock is connected to regulator 36 by lines 38 and 39 and to base current control unit 48 by line 46. Control unit 48 is connected to the base electrode of the TUT by line 50. Also connected to this electrode is line 54 of storage time tracker 52. The tracker connects to regulator 36 by line 56.

In the operation of the circuit of FIG. 1, the automated test sequence consists of supplying current having a given amplitude through inductor 12 to the TUT. After a predetermined period of time, the base of the TUT is reverse biased, cutting off the TUT. At the instant of cut off, the current flow is terminated. This latter event induces a voltage across the inductor of a sense (positive at the collector of the TUT and negative at the cathode of diode 16) which tends to maintain current flowing through the inductor. If a sufficient amount of energy, as determined by the relationship $E = \frac{1}{2} L I^2$ (where $L$ represents the inductance of the air core inductor 12), is stored by the inductor to cause second breakdown of the TUT, this breakdown is detected at 13 and the test is terminated. The second breakdown is manifested by a sudden drop in the collector-to-emitter voltage of the TUT. The current level at which this breakdown occurs may be measured, for example, by sensing the voltage across resistor 18. From this information, a safe operating level for the TUT may be determined. If second breakdown does not occur, the TUT is automatically rendered conductive once more after a predetermined interval and a collector current greater than the prior level by a known increment is supplied. The above sequence is repeated until second breakdown occurs, at which point the test is terminated. By increasing the current through the TUT in known increments, it is assured that only enough energy will be stored in inductor 12 to cause second breakdown. Because of the thermal time constant of the TUT, this energy level is not high enough to produce sufficient heating of the TUT to destroy or degrade it.

Base current control unit 48 has two functions. It provides the necessary base current for the TUT during the interval of a pulse from clock 46, when the TUT is to be conductive and when the TUT is to be cut off, this unit provides the necessary reverse bias to the base electrode. The collector current for the TUT is supplied by regulator 36. The initial current level is selected prior to the start of the test. The magnitude of the current is then automatically increased in incremental steps. Current is supplied from the beginning of a clock pulse until the TUT is switched off by unit 48.

The instant that the TUT is switched off is determined by sensing storage time. The storage time tracker 52 senses cut off by determining when the base-emitter capacitance of the TUT has discharged sufficiently to permit the base-emitter junction to become reverse biased. This point is defined herein as the point at which the TUT is cut off. The principles of operation of the tracker circuit ae described in greater detail in U.S. patent application Ser. No. 547,020, filed Feb. 4, 1975, entitled "Transistor Circuit" by Hugh Arnoldi et al., and assigned to the same assignee as the present invention.

When the TUT is cut off, as determined by tracker 52, current flow from regulator 36 is terminated. It is important to the operation of the circuit that current flow be terminated at the instant of cut off of the TUT. If it were terminated prior to this time, the energy stored by inductor 12 would be less than the anitcipated value, which may lead to erroneous test results. If the current flow was terminated after the TUT was cut off, excessive current might flow into the TUT when it went into second breakdown, resulting in its possible destruction.

Step ramp generator 30 provides a voltage to the regulator whose amplitude is increased in incremental steps. It is from this voltage that the collector current is derived. In addition, a test gate is provided that enables clock 40 to produce pulses during the gate interval. The generator circuit also determines the starting current level of the test sequence as well as the current level at which the test is terminated.

The function of diode 16 is to confine the energy stored by inductor 12 to a path comprising inductor 12, the collector-emitter path of the TUT and the diode. This path is defined herein as the energy loop.

Second breakdown detector 22 senses the second breakdown of the TUT from the rapid collapse of the collector-emitter voltage of the TUT. The rate of change of this voltage is very high compared with other voltage changes across the TUT. When breakdown occurs, signals from the detector disable the step ramp generator and prevent further testing until the test circuit is reset.

Clock 40, when enabled by the test gate from unit 30, provides clock pulses to generator 30, regulator 36 and control unit 48. In the present circuit, by way of example, these pulses may be of 0.5 millisecond (ms.) duration with an interpulse interval of 9.5 ms. In addition, an automatic turn off signal is provided to the regulator which disables the regulator when a predetermined amount of time has elapsed after each pulse. This automatic turn off signal prevents excessive current flow if no signal were received from the storage time tracker to turn off the regulator. Such a condition could arise, for example, if there were a short circuit across the collector-base or collector-emitter electrodes of the TUT.

Operation of the second breakdown tester is initiated by the application of a "Start-Test" signal to generator 30. In response to this signal, a test gate enables generation of pulses by clock 40. Base current is supplied to the TUT during each pulse interval by control unit 48 while collector current is supplied by regulator 36. During the clock interval, the regulator limited collector current charges inductor 12. Control unit 48 switches off the TUT by applying a reverse bias to its base electrode. Because the TUT has been operating in a saturation mode, the presence of stored charge within this device prevents its instant turn off. When storage time tracker 52 determines that the TUT is cut off, a command is sent to regulator 36 disabling that unit.

When current flow into inductor 12 is terminated, a voltage is induced across the inductor of a sense to keep current flowing in the original direction. The polarity of this voltage causes diode 16 to become forward biased during breakdown conditions. The energy stored by the inductor may not be sufficient to cause second breakdown of the TUT. If second breakdown does not occur, the TUT is rendered conductive once more by units 48 and 36 and a collector current is supplied to inductor 12 which is greater than the amplitude of the prior current by a pedetermined incremental amount. The previous sequence is repeated until a point is reached where the TUT is driven into second breakdown. At this point enough energy has been stored by inductor 12 to cause breakdown of the device but not its destruction. The second breakdown is detected by unit 22 which disables step ramp generator 30, which in turn prevents further current flow from regulator 36 into inductor 12. If second breakdown does not occur, the test sequence may also be automatically terminated when the maximum test current is reached or when the test gate interval has elapsed.

A more complete circuit schematic is shown in FIG. 2. Included in this figure are more detailed circuit diagrams of elements represented as blocks in the circuit of FIG. 1. Base current control unit 48 (bottom center) comprises an optical isolator 100 coupled between line 46 and the base of transistor 111. The collector-emitter path of transistor 111 is coupled between the base of transistor 102 and emitter ground. The emitter of transistor 102 is coupled by diode 105 to the collector of transistor 108 and by Zener diode 104 to the base of transistor 106. The emitter of transistor 106 is coupled to a terminal for an operating voltage $V_2$ as well as to the base of transistor 108 while the emitter of this latter device is connected via line 50 to the base of the TUT. The collector of transistor 108 is coupled through resistor 109 which may be variable to the terminal for voltage $V_2$. Also coupled to the emitter of transistor 102 is the base of transistor 112. The emitter and collector of this latter device are coupled to the collector and base respectively of transistor 114. The emitter of transistor 114 is coupled through resistor 118 which may be variable to a source of bias voltage 116 whose value also may be variable, while its collector is connected to line 50.

In the operation of the unit 48, in the absence of a clock pulse at line 46, transistor 111 is on and transistor 102 is off. As a result, transistors 112 and 114 are conductive. This is because the base of transistor 112 is coupled through a resistive divider to $V_3$, a source of negative potential. When transistors 112 and 114 are conductive, bias source 116 (which also provides a negative potential) is coupled to the base of the transistor under test thus providing a reverse bias for the test transistor.

When a clock pulse is applied to the input of optical isolator 100, transistor 111 is turned off and transistor 102 becomes conductive. The potential at the emitter of this latter device rises from a level at the emitter ground to a positive value that is large enough to both cause breakdown of Zener diode 104 and render transistors 112 and 114 nonconductive. When the Zener diode breaks down, transistors 106 and 108 become conductive, thereby supplying base current to the transistor under test. The value of this current may be determined by the values of resistor 109 and voltage $V_2$. Current will be supplied to the base of the test transistor for as long as the clock pulse is present on line 46. Diode 105 and Zener diode 104 ensure that transistor 108 does not saturate, thereby permitting more rapid cut off of the latter device at the termination of the pulse. The function of the optical isolator 100 is simply to permit system ground and emitter ground to be at independent levels.

Storage time tracker 52 comprises a resistor 120 connected between the base of the transistor under test by line 54 and the input electrode of Darlington transistor pair 122. The output of the transistor pair is coupled to the input of optical isolator 124. The output of the optical isolator is coupled by line 56 to regulator 36. In the operation of the tracker, when a reverse bias is applied to the base electrode of the transistor under test by unit 48, the TUT 10 will continue to conduct for a short period of time. This is because the base-emitter capacitance of the TUT is still charged to a potential tending to forward bias this junction. Until this capacitance discharges, the base of the TUT is not reverse biased. So long as the base of the TUT 10 is charged to a relatively positive potential with respect to the emitter of the TUT, then Darlington pair 122 of the storage time tracker is nonconductive.

When this junction capacitance has discharged and the base of the TUT 10 is truly reverse biased, the TUT is considered cut off for purposes of this test. At this instant, Darlington pair 122 will no longer be held off. When this pair conducts, a signal is supplied through optical isolator 124 to the current regulator 36. This signal disables the latter device, thereby stopping the flow of current into the collector of the TUT at the instant that it is cut off. The function of optical isolator 124 is to provide a signal referenced to a system ground that has been derived from a signal referenced to emitter ground.

Second breakdown detector 22 (lower right) comprises capacitor 140, which is connected to the collector 13 of the TUT by line 24. Connected between the emitter of transistor 142 and system ground is the parallel combination of diode 144, bias resistor 150 and serially-connected inductor 146 and diode 148. The base of transistor 142 is also connected to system ground. The collector of transistor 142 is connected to monostable multivibrator 152. The output of this multivibrator is connected to bistable multivibrator 154. The output of the bistable circuit is connected via line 26 to the step ramp generator and via inverter transistor 156 by line 28 also to the step ramp generator.

Transistor 142 is normally cut off. When the TUT goes into second breakdown, the decrease of the collector-emitter path impedance is accomplished by a rapid collapse of its collector voltage. This collapse is detected by the high pass filter formed by capacitor 140 and inductor 146. The momentary presence of a negative voltage at the emitter of transistor 142 permits this device to conduct for a brief instant, thereby supplying a trigger to monostable multivibrator 152. The output of the monostable triggers bistable multivibrator 154. When so triggered, this latter unit is set to a state that prevents further testing by inhibiting operation of the step ramp generator 30. Testing remains inhibited until flip-flop 154 is reset. The function of diodes 144 and 148 is simply to prevent false triggering due to ringing. Monostable multivibrator 152 is used to buffer the input circuit of the bistable multivibrator from transistor 142.

Step ramp generator 30 (upper left) includes monostable multivibrator 160. The input terminal 162 of this multivibrator is connected to detector 22 by line 28. Also connected to this terminal is a source of "Start Test" commands (not shown). The multivibrator $\overline{Q}$ output is coupled to the base of transistor 164 while its Q output (this signal being the logical complement of the $\overline{Q}$ output) is coupled via line 42 to clock 40. The input terminal 166 of monostable multivibrator 168 is coupled to the collector of transistor 170. The emitter of this transistor is connected to system ground while its base is coupled to the output of comparator 173 as well as, via line 26, detector 22.

The base of transistor 172 is coupled through line 44 to clock 40. Its emitter is coupled to a system ground while its collector is coupled, through Zener diode 174, to a point to which an operating voltage may be applied as well as to the base of transistor 176. The emitter of transistor 176 is coupled through resistor 177 to a point to which an operating voltage may be applied while its collector is coupled to the input terminal of amplifier 178. Capacitor 180 is connected between this terminal and the output terminal of amplifier 182. Connected in parallel with the capacitor is the collector-emitter path of transistor 164. The output of amplifier 178 is coupled to input terminal 184 of comparator 173 and, via line 32, to regulator 36. Terminal 184 is also connected to the collector of transistor 196. The emitter of this device is connected to system ground while its base is coupled via line 34 to regulator 36.

Input terminal 186 of comparator 173 is coupled through a variable resistance 194 to an operating potential $V_4$. The output of amplifier 182 is connected to its input terminal 192 while input terminal 190 is coupled to operating potential $V_4$ by variable resistor 188.

In the operation of generator 30, a "Start Test" command, which may be a momentary voltage, triggers multivibrator 160, producing pulses at output terminals Q and $\overline{Q}$ whose duration equals the maximum interval for the test sequence. The Q signal enables clock operation over its duration and is defined as the test gate. The $\overline{Q}$ signal renders transistor 164 nonconductive over the test gate interval. Clock pulses applied to the base of transistor 172 render this device conductive during each pulse interval, which in turn permits conduction of transistor 176 over the same interval. When transistor 176 is conductive (and transistor 164 is nonconductive), charge flows into capacitor 180 at a rate determined primarily by the value of resistor 177 and capacitor 180. Because there is no discharge path for the capacitor between clock pulses, i.e. transistors 176 and 164 are nonconducting and the input impedance of amplifier 178 is very high, the voltage across the capacitor increases in incremental steps in response to each clock pulse. This voltage is applied through amplifier 178 via line 32 to amplifier 204 of regulator unit 36. It is from this voltage that the earlier-mentioned incrementally increasing test current is derived.

Amplifier 182 provides a variable offset voltage which permits the starting current level to be greater than zero if desired. Comparator 173 senses the output voltage of amplifier 178 and terminates the test when the voltage at input terminal 184 is in excess of a value determined by the voltage present at its input terminal 186. A means is thus provided for terminating the test when a voltage is present at terminal 184 which corresponds to the maximum current that is to be applied to the TUT even though second breakdown has not occurred. When this maximum voltage level is reached, the comparator output voltage turns on transistor 170. This triggers multivibrator 168 whose output provides a "clear" signal to multivibrator 160. When this occurs, the test gate is terminated, inhibiting further clock pulses and transistor 164 conducts, discharging capacitor 180 thereby ending the test sequence. Transistor 196 prevents termination of the test until flip-flop 200 has been set, thereby preventing the test from ending until the final clock pulse has terminated. When second breakdown occurs, the signal coupled to the base of transistor 170 from detector 22 terminates the test sequence in the same manner as that described above. The detector signal present at terminal 162 of multivibrator 160 in response to breakdown inhibits further testing until detector flip-flop 154 is reset.

Programmable current regulator 36 (upper right) includes flip-flop 200. The $\overline{RD}$ and T inputs of this device are coupled to clock 40 by lines 38 and 39, respectively, while the $\overline{SD}$ input is connected to tracker 52 by line 56. The Q output of the flip-flop is coupled to the base of transistor 202 while the $\overline{Q}$ output is coupled to the base of transistor 196 via line 34 as well as to the strobe input S of programmable differential amplifier 204 through resistor 201. This amplifier may be an RCA 3094T which is commercially available. The noninverting input (+) of amplifier 204 is coupled by line 32 to the output of amplifier 178 while the inverting input (−) is coupled via line 60 to emitter ground point 14. The "current sink" output of amplifier 204 is coupled to the base of transistor 206.

The collector of transistor 202 is coupled to the base of transistor 208 while the emitter of the latter device is coupled through a source of reverse bias 214 to a terminal for an operating potential $V_5$. The collector of transistor 208 is coupled to the base of transistor 210 and the emitter of transistor 206. The collector of the latter device is connected to system ground while the emitter of transistor 210 is connected to the terminal for voltage $V_5$. The collector of transistor 210 is coupled to diode 212, which in turn, is connected by line 58 to inductor 12.

In the operation of the regulator circuit, a clock pulse applied via line 38 to the $\overline{RD}$ input of flip-flop 200 causes it to reset. This means that the $\overline{Q}$ output goes high, thus enabling amplifier 204 by applying a positive voltage to the strobe input S. The amplifier gain may be controlled by the value of resistor 201 which determines the amplifier bias current. At the same instant, the flip-flop Q output goes low, rendering transistors 202 and 208 nonconductive. Amplifier 204 receives the step ramp voltage produced by generator 30. This voltage permits amplifier 204 to sink the base current of transistor 206, rendering it conductive. This causes transistor 210 to conduct, supplying a current to the TUT via a path comprising diode 121, line 58 and inductor 12. This current is proportional to the base current of transistor 206.

Current regulation is realized by sensing the voltage across the emitter resistor 18 of the TUT. This voltage is applied via line 60 to the inverting terminal of amplifier 204. As the step ramp voltage increases, the voltage at the noninverting input is greater than the voltage present at the inverting input, tending to increase the base current of transistor 206. As transistor 210 supplies an increased current to the TUT, the voltage across resistor 18, which is also the voltage applied to the inverting terminal, increases. As this voltage approaches the value of the step ramp voltage, the current sinking capacity of the amplifier decreases, tending to decrease current flow through transistors 206 and 210 thereby maintaining the TUT current at the desired level.

After the TUT is switched off, tracker 52 supplies a set signal to the $\overline{SD}$ input of flip-flop 200 at the instant that the TUT is truly cut off. This causes the Q output of 200 to go high and the $\overline{Q}$ output to drop to a level at a reference potential. As a result, the strobe signal is removed from amplifier 204, switching this device off. This removes the base drive from transistor 206 which, in turn, removes the base drive from transistor 210. At the same time, the Q output renders transistors 202 and 208 conductive. When transistor 208 conducts, bias source 214 is coupled across the base-emitter junction of transistor 210, reverse biasing this junction, thereby ensuring that the latter device is switched off rapidly. Rendering transistor 210 nonconductive interrupts the flow of current to the TUT.

An additional signal is supplied by clock 40 to flip-flop 200 via line 39. When a predetermined period has elapsed after each clock pulse, this signal, applied to the T input, causes the flip-flop to set, thereby terminating current flow to the TUT. The purpose of this additional signal is to remove current from the TUT in the event that a circuit fault such as a short circuit across the TUT has prevented the set signal from being generated.

Clock 40 includes pulse generator 240, whose output terminal 242 is coupled to the inputs of monostable multivibrator 244 and inverter 246 as well as to the base of transistor 172 through line 44. The output of multivibrator 244 is coupled by line 39 to the T input of multivibrator 200 while the $\overline{RD}$ input of 200 is coupled to a first output of inverter 246 by line 38. The second output of inverter 246 is coupled through transistor 248 and line 46 to the input of optical isolator 100.

In the operation of the clock 40, pulse generator 240 is a free running oscillator producing pulses having, in the circuit of the present embodiment, 0.5 ms. width and a 10 ms. period. The pulses are coupled via line 44 directly to transistor 172 where they control the charging intervals of capacitor 180. The pulses are inverted and applied to flip-flop 200 where they function as reset signals that enable operation of regulator 36. Inverter 246 and transistor 248 provide double inversion of the pulses, as well as the necessary gain to drive optical isolator 100 which in turn enables base current to be supplied to the TUT.

Monostable multivibrator 244 produces an output signal in response to a clock pulse. This output signal is supplied to the flip-flop 200 which disables the current regulator a predetermined interval after each clock pulse.

Resistors 18 and 118 should be noninductive and the tolerance of each should be not more than one and five percent, respectively. The inductor 12 is preferably of single layer air core construction, mounted on noninductive material and kept free of all metal surfaces. This method of construction tends to reduce the stray capacitance associated with coil 12. By way of example, a 100µh coil was realized using 51 turns of AWG12 solid copper wire wound ten turns to the inch on a three inch diameter tube. Supply voltage levels for the curcuit of FIG. 2 may have the following values: $V_1 = +5$; $V_2 = +20$; $V_3 = -5$; $V_4 = +15$; and $V_5 = +36$.

What is claimed is:

1. A test circuit for a bipolar transistor, said transistor having collector and emitter electrodes defining a conduction path therebetween and a control electrode comprising, in combination:
   energy storage means connected in series with said path to form a series circuit;
   means for applying successively larger currents to said series circuit;
   means for applying a forward bias to said control electrode while applying said successively larger currents;
   means, after each application of a current to said series circuit, for concurrently interrupting the flow of said current and changing the bias applied to said control electrode from a forward to a reverse bias;
   means responsive to the voltage across said energy storage means when said current is interrupted for providing a low impedance path across said series circuit in a direction to permit current flow from said energy storage means through said conduction path and said low impedance path back to said energy storage means; and
   means for indicating a rapid decrease in the voltage between the collector and emitter electrodes of said transistor while said reverse bias is present.

2. The combination of claim 1 wherein said energy storage means comprises an inductance.

3. The combination of claim 1 wherein said means responsive to the voltage comprises a diode coupled across said series circuit.

4. The circuit of claim 1 wherein said means for applying successively larger currents comprises, in combination:
   a capacitance;
   means for charging said capacitance to successively higher voltage levels in response to a command voltage;
   means responsive to said voltage levels for producing a current proportional to said levels; and
   first switching means for coupling said current to said series circuit in response to a first control signal and interrupting the flow of said current in response to a second control signal.

5. The combination of claim 1 wherein said means for applying a forward bias comprises second switching means in the path between the source of said forward bias and said transistor control electrode, and means for closing said second switching means in response to said first control signal and for opening the same in response to said second control signal.

6. The combination of claim 1 wherein said means for changing the bias applied to said control electrode comprises third switching means in the path between the source of said reverse bias and said transistor control electrode, and means for opening said third switching means in response to said second control signal and for closing the same in response to said first control signal.

7. The combination of claim 1 wherein said means for indicating a rapid decrease in the voltage comprises a high pass filter circuit coupled between said collector electrode and a point at a reference potential, said filter producing an output signal whenever the rate of said rapid decrease is in excess of a predetermined value.

8. The combination of claim 1 further including means responsive to voltage between said control electrode and said emitter electrode for ensuring that the interrupting of the flow of said current does not occur until said voltage is indicative of a reverse bias condition.

9. Apparatus for testing a bipolar transistor, said transistor having a control electrode, and collector and emitter electrodes defining a main conduction path therebetween, for reverse biased voltage second breakdown comprising, in combination:
   an inductance coupled to said conduction path forming a series path therewith;
   means for supplying a current to said series path, whose amplitude increases in predetermined increments;
   means for rendering said transistor nonconductive by concurrently changing the control electrode bias from a forward to a reverse bias and for disabling said means for supplying a current at a predetermined time after each current amplitude increase until said breakdown occurs, said breakdown being manifested by a rapid decrease in the potential across said conduction path;
   an asymmetrically conducting element coupled across said series path, said element presenting a relatively high impedance to current flowing from said means for supplying a current and a relatively low impedance to current flowing through said series path when said breakdown occurs; and
   means for detecting said rapid decrease in the potential.

10. The circuit of claim 9 wherein said means for supplying a current comprises, in combination:
    a capacitance;
    means for charging said capacitance to successively higher voltage levels in response to a command voltage;
    means responsive to said voltage levels for producing a current proportional to said levels; and
    first switching means for coupling said current to said series path in response to a first control signal and interrupting the flow of said current in response to a second control signal.

11. The combination of claim 9 wherein said means for detecting said rapid decrease in the voltage comprises a high pass filter circuit coupled between said conduction path and a point at a reference potential, said filter producing an output signal whenever the rate of said decrease is in excess of a predetermined value.

12. The combination of claim 9 further including means responsive to voltage between said control electrode and said emitter electrode for ensuring that the interrupting of the flow of said current does not occur until said voltage is indicative of a reverse bias condition.

* * * * *